(12) United States Patent  
Yang et al.

(10) Patent No.: US 10,861,447 B2  
(45) Date of Patent: Dec. 8, 2020

(54) DEVICE FOR RECOGNIZING SPEECHES AND METHOD FOR SPEECH RECOGNITION

(71) Applicant: BOE Technology Group Co., Ltd., Beijing (CN)

(72) Inventors: Xun Yang, Beijing (CN); Xiangdong Yang, Beijing (CN); Xingxing Zhao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 154 days.

(21) Appl. No.: 16/006,363

(22) Filed: Jun. 12, 2018

(65) Prior Publication Data

US 2019/0057687 A1   Feb. 21, 2019

(30) Foreign Application Priority Data

Aug. 18, 2017   (CN) .......................... 2017 1 0711864

(51) Int. Cl.
| | |
|---|---|
| *H03G 3/32* | (2006.01) |
| *G10L 15/20* | (2006.01) |
| *G10L 15/22* | (2006.01) |
| *G10L 25/84* | (2013.01) |
| *G10L 25/21* | (2013.01) |

(52) U.S. Cl.
CPC ............. *G10L 15/20* (2013.01); *G10L 15/22* (2013.01); *G10L 25/84* (2013.01); *G10L 25/21* (2013.01); *H03G 3/32* (2013.01)

(58) Field of Classification Search
CPC .................................. G10L 15/24; H03G 3/32
See application file for complete search history.

(56) References Cited

U.S. PATENT DOCUMENTS 7,167,544 B1 * 1/2007 Bauer ..................... G10L 15/22  
379/88.01  
8,135,148 B2 * 3/2012 Jin ........................ H04M 1/6008  
381/108

(Continued)

FOREIGN PATENT DOCUMENTS

DE       112016005648 T5 * 8/2018 ............. G06F 3/011  
JP        2000194386   * 12/1998

(Continued)

*Primary Examiner* — Feng-Tzer Tzeng  
(74) *Attorney, Agent, or Firm* — McDermott Will & Emery LLP

(57) ABSTRACT

The embodiments of the present disclosure provide a device for recognizing speeches and a method for speech recognition. The device for recognizing speeches may comprise a processor, configured to execute instructions stored in the memory, to: perform speech recognition on the collected audio data to obtain a semantic content of the audio data; match the obtained semantic content with a semantic data stored in the database; determine whether the audio data contains ambient noise audio information and audio information of a user, in response to determining that the obtained semantic content does not match with the semantic data; and change conditions for collecting the audio data and control to collect the audio data with the changed conditions, in response to determining that the audio data contains the ambient noise audio information and the audio information of the user.

6 Claims, 4 Drawing Sheets

(56) References Cited

U.S. PATENT DOCUMENTS 9,560,316 B1 * 1/2017 Lindberg ................ G10L 25/60
2008/0167868 A1 * 7/2008 Kanevsky ............... G10L 15/24
704/233

FOREIGN PATENT DOCUMENTS

JP          3287747 B2 *  6/2002
JP          4131392 B2 *  8/2008

* cited by examiner

DEVICE FOR RECOGNIZING SPEECHES AND METHOD FOR SPEECH RECOGNITION

CROSS-REFERENCE TO RELATED APPLICATION

This application claims the priority of Chinese Patent Application No. 201710711864.8 filed on Aug. 18, 2017, the disclosure of which is incorporated herein by reference in its entirety as part of this application.

TECHNICAL FIELD

Embodiments of the present disclosure relate to the field of speech recognition, and in particular, to a device for recognizing speeches and a method for speech recognition.

BACKGROUND

Speech recognition technology refers to a technology in which a machine converts an audio signal into a text or a command. In a speech recognition process, the sensitivity for collecting the audio signal is relatively high, resulting in collecting an ambient noise that may interfere with the speech recognition process.

SUMMARY

According to an aspect of embodiments of the present disclosure, there is provided a device for recognizing speeches, comprising: a collecting circuit, configured to collect an audio data; a memory, configured to store instructions and a database; and a processor, configured to execute instructions stored in the memory, to: perform speech recognition on the collected audio data to obtain a semantic content of the audio data; match the obtained semantic content with a semantic data stored in the database; determine whether the audio data contains ambient noise audio information and audio information of a user, in response to determining that the obtained semantic content does not match with the semantic data; and change conditions for collecting the audio data and control to collect the audio data with the changed conditions, in response to determining that the audio data contains the ambient noise audio information and the audio information of the user.

For example, the conditions may comprise an input volume of the audio data and a voltage amplitude used for collecting the audio data by the collecting circuit; and the processor is further configured to: in response to determining that the audio data contains the ambient noise audio information and the audio information of the user, determine whether the input volume of the audio data reaches a maximum receivable volume during a period of collecting the audio data via the collecting circuit; and in response to determining that the input volume of the audio data does not reach the maximum receivable volume, prompt the user to increase the input volume of the audio information of the user, control the collecting circuit to reduce the voltage amplitude used for collecting the audio data, and re-input the audio data.

For another example, the processor may be further configured to: in response to determining that the input volume of the audio data reaches a maximum receivable volume, prompt the user to reduce an ambient noise in a surrounding environment and to re-input the audio data.

For another example, the processor may be further configured to: in response to determining that the audio data does not contain the ambient noise audio information, prompt the user to re-input the audio data.

For another example, the processor may be further configured to: in response to determining that the obtained semantic content does not match with the semantic data, compare an input power of the audio data with a preset power; and in response to the input power of the audio data being greater than the preset power, determine that the audio data contains the ambient noise audio information and the audio information of the user.

According to another aspect of the embodiments of the present disclosure, there is provided a method for speech recognition, comprising: collecting an audio data; performing speech recognition on the collected audio data so as to obtain a semantic content of the audio data; matching the obtained semantic content with a semantic data stored in a database; determining whether the audio data contains ambient noise audio information and audio information of a user, in response to determining that the obtained semantic content does not match with the semantic data; and changing conditions for collecting the audio data and controlling to collect the audio data with the changed conditions, in response to determining that the audio data contains the ambient noise audio information and the audio information of the user.

For example, the conditions may comprise an input volume of the audio data and a voltage amplitude used for collecting the audio data; wherein changing the conditions for collecting the audio data comprises: determining whether the input volume of the audio data reaches a maximum receivable volume during a period of collecting the audio data; and prompting the user to increase the input volume of the audio information of the user, controlling to reduce the voltage amplitude used for collecting the audio data, and controlling to collect the audio data with a reduced voltage amplitude, in response to determining that the input volume of the audio data does not reach the maximum receivable volume.

For another example, the method according to the embodiments of the present disclosure may further comprise prompting the user to reduce an ambient noise in a surrounding environment and to re-input the audio data, in response to determining that the input volume of the audio data reaches a maximum receivable volume.

For another example, the method according to the embodiments of the present disclosure may further comprise prompting the user to re-input the audio data in response to determining that the audio data does not contain the ambient noise audio information.

For another example, the method according to the embodiments of the present disclosure may further comprise comparing an input power of the audio data with a preset power, in response to determining that the obtained semantic content does not match with the semantic data; and determining that the audio data contains the ambient noise audio information and the audio information of the user, in response to the input power of the audio data being greater than the preset power.

It is understood that other embodiments and configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

The above and other features and advantages of the present disclosure will become more apparent and a more comprehensive understanding of the present disclosure can be obtained, by describing in detail exemplary embodiments thereof with reference to the accompanying drawings, in which.

DETAILED DESCRIPTION

The solutions of the embodiments of the present disclosure will be described clearly and completely with reference to the accompanying drawings. Obviously, the described embodiments are only a part but not all of the embodiments of the present disclosure. All other embodiments obtained by persons skilled in the art based on the described embodiments of the present disclosure without creative efforts shall also fall within the scope of the present disclosure.

The device for recognizing speeches provided in the embodiment of the present disclosure may be a voice interaction device with a far-field recognition function, for example, a smart picture frame, a smart furniture, and the like. Of course, it can also be applied to other scenes for speech recognition as needed, which is not limited herein.

Figure 1:
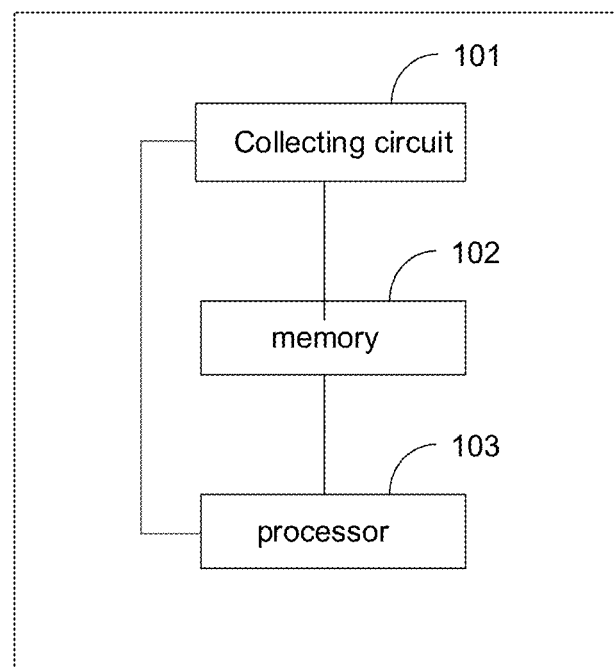
FIG. 1 shows a schematic block diagram illustrating a device for recognizing speeches according to an embodiment of the present disclosure.

FIG. 1 shows a schematic block diagram illustrating a device for recognizing speeches 10 according to an embodiment of the present disclosure. The device 10 may a collecting circuit 101, a memory 102 and a processor 103. The collecting circuit 101 is configured to collect an audio data. The memory 102 is configured to store instructions and a database. The processor 103 is configured to execute instructions stored in the memory, to: perform speech recognition on the collected audio data to obtain a semantic content of the audio data; match the obtained semantic content with a semantic data stored in the database; determine whether the audio data contains ambient noise audio information and audio information of a user, in response to determining that the obtained semantic content does not match with the semantic data; and change conditions for collecting the audio data and control to collect the audio data with the changed conditions, in response to determining that the audio data contains the ambient noise audio information and the audio information of the user.

According to the embodiment of the present disclosure, if the device for recognizing speeches is disposed in a noise environment, such as in an environment where a plurality of people are speaking, the collecting circuit will collect the speeches of everyone, resulting in a confused result for recognizing semantic content and a failure in recognizing a user's intention. For example, the audio data collected by the collecting circuit 101 contains the audio information of the user made by the user and the ambient noise audio information made by other people in the surrounding environment. The voltage amplitude of the audio information of the user and the voltage amplitude of the ambient noise audio information are both greater than the minimum voltage amplitude recognizable by the device. Therefore, after performing speech recognition on the audio data, the recognized semantic content may not match with the semantic data in the semantic library, and thus cannot be correctly responded.

According to an embodiment of the present disclosure, the processor 103 is configured to determine whether the audio data contains ambient noise audio information and audio information of a user according to the sematic content and an input power of the audio data, in response to determining that the first speech recognition for the audio data fails, i.e., the semantic content does not match with the semantic data in the semantic library. For example, the processor matches the semantic content recognized in the speech recognition process with the semantic data in the semantic library, and determines whether the input power of the audio data is greater than the preset power. When it is determined that the semantic content does not match with the semantic data in the semantic library and the input power of the audio data is greater than the preset power, it is determined that the audio data contains the ambient noise audio information and the audio information of the user; otherwise, it is determined that the audio data does not contain the ambient noise audio information.

If only the input power of the audio data is used for determination, it cannot be determined that whether it is in a noisy environment when a user speaks a loud voice or plays music in a quiet environment, since the input power of the audio is also large. If only the recognized semantic content is used for determination, the audio data made by a user in a quiet environment may not be able to match with the semantic data in the semantic library. In order to determine whether audio data contains both ambient noise audio information and audio information of the user accurately, a combination may be used.

It may be determined whether the audio data contains ambient noise audio information and audio information of the user based on the input power of the audio data collected by the collecting circuit. When the device for recognizing speeches is in a noisy environment, the device may simultaneously collect and recognize conversations of multiple people. This may cause that the result for speech-to-text conversion does not conform to normal grammar or does not match with the semantic data in the semantic library, making the processor being not able to infer the user's real intention. Therefore, the input power of the audio data can be considered. If the input power is relatively large, it is determined that the noise in the current environment is large, and the audio data contains both the ambient noise audio information and the audio information of the user. Otherwise, it is determined that the audio data does not contain the ambient noise audio information.

If the recognized semantic content cannot match with the semantic data in the semantic library, it is necessary to re-collect the audio data. If it is determined that the audio data contains the ambient noise audio information and the audio information of the user, it is indicated that the speeches of other people in the environment may have an influence on the result for speech recognition (i.e. there is ambient noise audio information). Meanwhile, since the embodiments of the present disclosure can be applied in a case that speeches of other people in the environment may have an influence on the speech of interested people, in order to reduce the influence of the speeches of other people, the processor 103 can determine the conditions for collecting the audio data in a next time according to the input volume of the audio data and the used voltage amplitude during the period of collecting the audio data via the collecting circuit 101. Then, the processor 103 can control the collecting circuit 101 to use the newly determined conditions for collecting the audio data, so as to improve the effect of speech recognition.

If the semantic content recognized in the next speech recognition process can be matched with the semantic data in the semantic library, subsequent operations are directly performed. If the semantic content recognized in the next speech recognition process still does not matched with the semantic data in the semantic library, the processor 103 continues to determine whether the collected audio data contains the ambient noise audio information and the audio information of the user, and repeats the above operations.

The processor 103 may be configured to determine whether the input volume of the audio data reaches a maximum receivable volume during a period of collecting the audio data via the collecting circuit, in response to determining that the audio data contains the ambient noise audio information and the audio information of the user. The processor 103 may be further configured to prompt the user to increase the input volume of the audio information of the user, and re-input the audio data, when it is determined that the input volume of the audio data does not reach the maximum receivable volume.

In addition, the processor 103 may be also configured to reduce the voltage amplitude used for collecting the audio data, and to control the collecting circuit to collect the audio data with the reduced voltage amplitude for the next speech recognition process.

When the voltage amplitude of the audio information of the user is greater than the minimum voltage amplitude recognizable by the device and the voltage amplitude of the ambient noise audio information is smaller than the minimum voltage amplitude, only the audio information of the user can be collected. That is, the collected audio data only contains the audio information of the user. Then, the next speech recognition process is performed for the newly collected audio data.

Figure 2A:
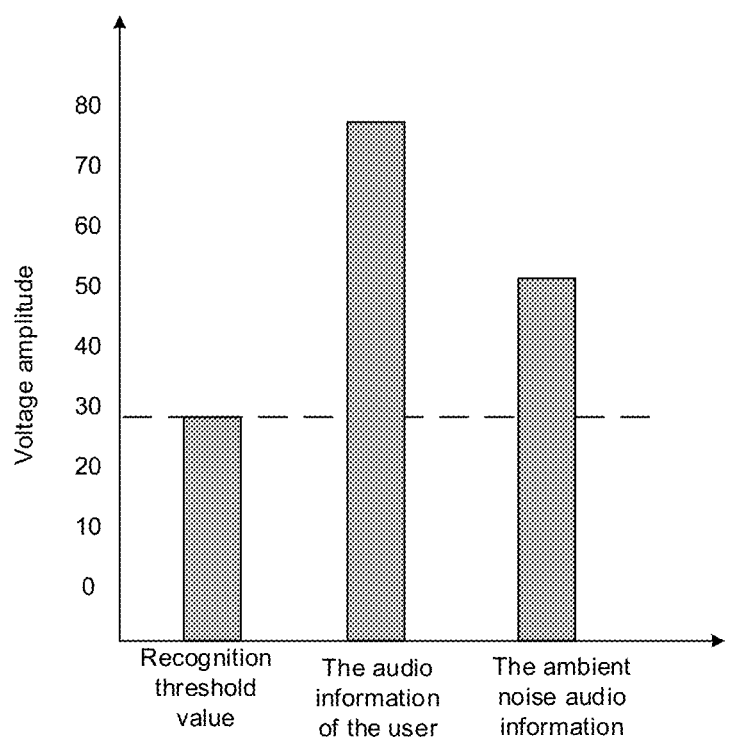
FIG. 2a shows a schematic diagram illustrating voltage amplitudes when audio data cannot be recognized according to an embodiment of the present disclosure.

In the noisy environment, it is likely to collect the speeches of other people and the interested user in the environment both. FIG. 2*a* shows a schematic diagram illustrating voltage amplitudes when audio data cannot be recognized according to an embodiment of the present disclosure. At this time, the voltage amplitudes of the audio information of the user and the ambient noise audio information made by others are both greater than the minimum voltage amplitude recognizable by the device for recognizing speeches (i.e., a recognition threshold value), so the user needs to be prompted to improve the voice volume. Then, the processor 103 may control the collecting circuit 101 to collect audio data using the reduced voltage amplitude.

Figure 2B:
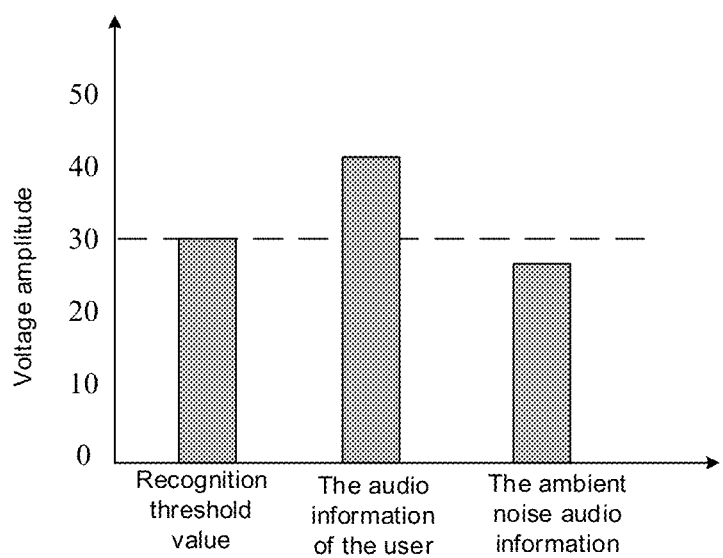
FIG. 2b shows a schematic diagram illustrating voltage amplitudes when audio data can be recognized according to an embodiment of the present disclosure.

The voltage amplitudes of all collected audio data (including the audio information of the user and the ambient noise audio information) will decrease when the voltage amplitude used for collecting the audio data is reduced. However, the recognition threshold value (that is, the minimum voltage amplitude recognizable by the device) will not be changed. Since the user has been prompted to increase the input volume of the audio information of the user, the voltage amplitude for the audio information of the user will be greater than the voltage amplitude for the ambient noise audio information. FIG. 2*b* shows a schematic diagram illustrating voltage amplitudes when audio data can be recognized according to an embodiment of the present disclosure. When the voltage amplitude for the audio information of the user is greater than the recognition threshold value and the voltage amplitude for the ambient noise audio information is less than the recognition threshold value, as shown in FIG. 2*b*, the audio information of the user can be accurately recognized.

It should be noted that the collecting circuit 101, the memory 102, and the processor 103 may be all integrated in the device for recognizing speeches, and may also be configured as separated structures, or may be provided as an integrated structure that is integrated together.

Those skilled in the art can understand that on the basis of the above-mentioned device for recognizing speeches disclosed in the present disclosure, it is likely to make simple modifications and obtain other feasible hardware structures. The present disclosure only describes one example and is not used to limit the present invention.

For example, the device for recognizing speeches may include a microphone array as the collecting circuit 101, a digital potentiometer, and a processor. After being collected by the microphone array, the audio data is divided by a digital potentiometer and then passed to the processor. The processor determines whether the audio data contains the ambient noise audio information and the audio information of the user according to the recognized semantic content and the input power of the audio data. In response to determining that the audio data contains the ambient noise audio information and the audio information of the user, the processor may send a signal to the digital potentiometer, adjust the resistance of the voltage dividing resistor so as to adjust the input voltage for the audio data, reduce the voltage amplitude for collecting the audio information, and prompt the user to increase the input volume of the audio information of the user. When the voltage amplitude for the ambient noise audio information is less than the recognition threshold value and the voltage amplitude for the audio information of the user is greater than the recognition threshold value, the user's voice can be accurately identified.

When the processor 103 determines that the audio data contains the ambient noise audio information and the audio information of the user, the step of collecting the audio data is performed as described above. If it is determined that the audio data does not contain the ambient noise audio information, the user is directly prompted to re-enter the audio data and collect the audio data for the next speech recognition process.

If it is determined according to the recognized semantic content and the input power of the audio data that the audio data does not contain the ambient noise audio information, the speech recognition may fail due to other reasons (for example, the speaking speed is too fast, or the speech is not clear), and the user may be prompted to re-input the audio information again at this time.

If the processor 103 determines that the input volume of the audio data during the period of collecting the audio data does not reach the maximum receivable volume, the operation of collecting the audio data is performed as discussed above. If it is determined that the input volume of the audio data reaches the maximum receivable volume, the user is prompted to reduce the ambient noise in the surrounding environment and re-input the audio data.

For example, if the processor 103 determines that the audio data contains the ambient noise audio information and the audio information of the user and the audio data has reached the maximum receivable volume, it is indicated that the noise in the current environment is too large, resulting in a failure of speech recognition. Therefore, the user is prompted to reduce the noise in the current environment (i.e., reduce the voice of other people) and re-input the audio data, and then re-collect the audio data to perform the next speech recognition process.

Figure 3:
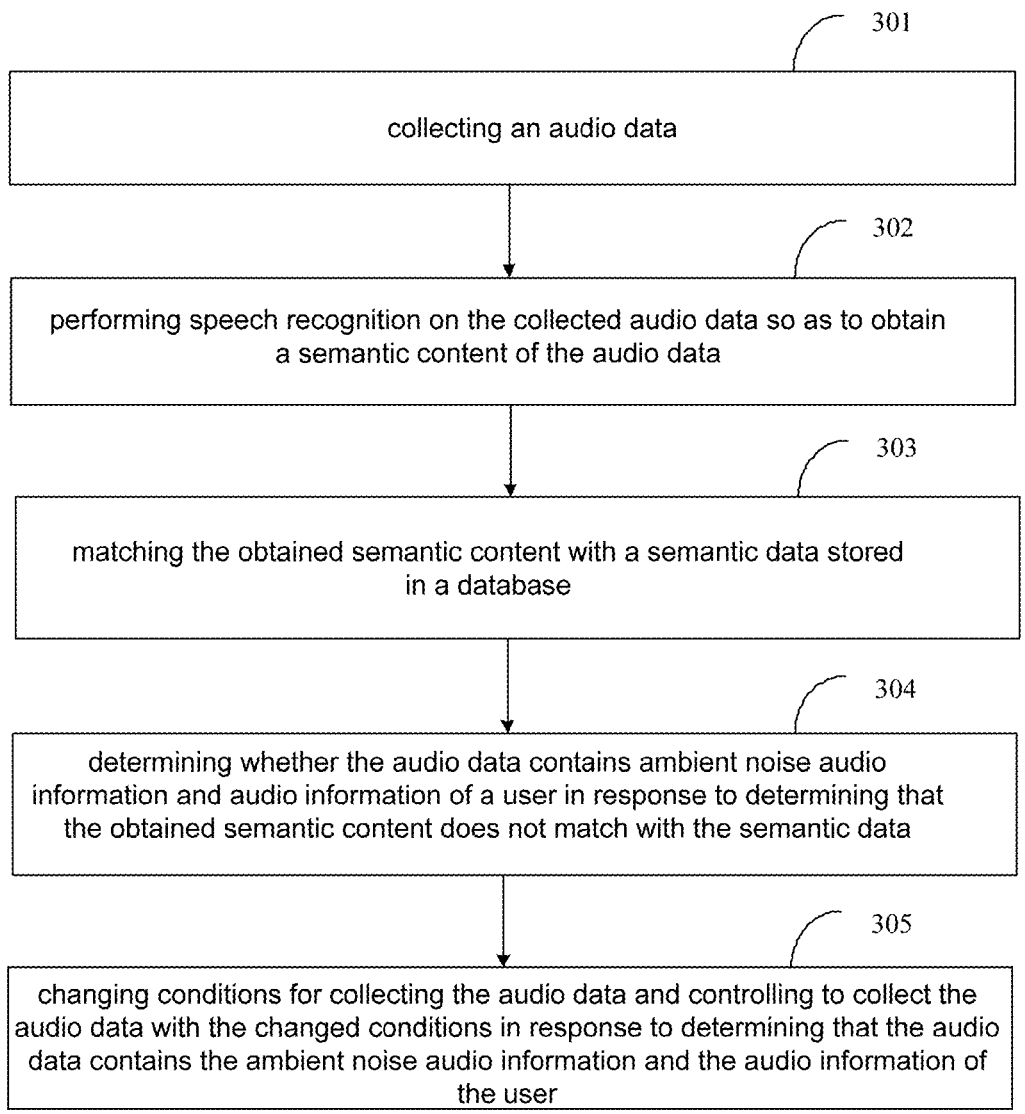
FIG. 3 shows a flowchart illustrating a speech recognition method according to an embodiment of the present disclosure.

The embodiment of the present disclosure also provides a method for speech recognition. FIG. 3 shows a flowchart illustrating a speech recognition method according to an embodiment of the present disclosure. As shown in FIG. 3, the method 30 according to an embodiment of the present disclosure may include steps as follows: in step 301, collecting an audio data; in step 302, performing speech recognition on the collected audio data so as to obtain a semantic content of the audio data; in step 303, matching the obtained semantic content with a semantic data stored in a database; in step 304, determining whether the audio data contains ambient noise audio information and audio information of a user, in response to determining that the obtained semantic content does not match with the semantic data; and in step 305, changing conditions for collecting the audio data and controlling to collect the audio data with the changed conditions, in response to determining that the audio data contains the ambient noise audio information and the audio information of the user.

According to an embodiment of the present disclosure, when it is determined that the audio data contains the ambient noise audio information and the audio information of the user, it is determined that whether the input volume of the audio data reaches a maximum receivable volume during a period of collecting the audio data. In response to determining that the input volume of the audio data does not reach the maximum receivable volume, the user is prompted to increase the input volume of the audio information of the user, to reduce the voltage amplitude used for collecting the audio data, and to control to collect the audio data with a reduced voltage amplitude for the next speech recognition process.

When it is determined that the input volume of the audio data reaches a maximum receivable volume, the user may be prompted to reduce the ambient noise in a surrounding environment and to re-input the audio data.

When it is determined that the audio data does not contain the ambient noise audio information, the user is prompted to re-input the audio information.

In addition, determining whether the audio data contains the ambient noise audio information and the audio information of the user may include: determining that the recognized semantic content does not match with the semantic data in the semantic library; and determining whether the input power of the audio data is greater than a preset power. When the semantic content does not match with the semantic data in the semantic library and the input power of the audio data is greater than the preset power, it is determined that the audio data contains the ambient noise audio information and the audio information of the user. Otherwise, it is determined that the audio data does not contain the ambient noise audio information.

Figure 4:
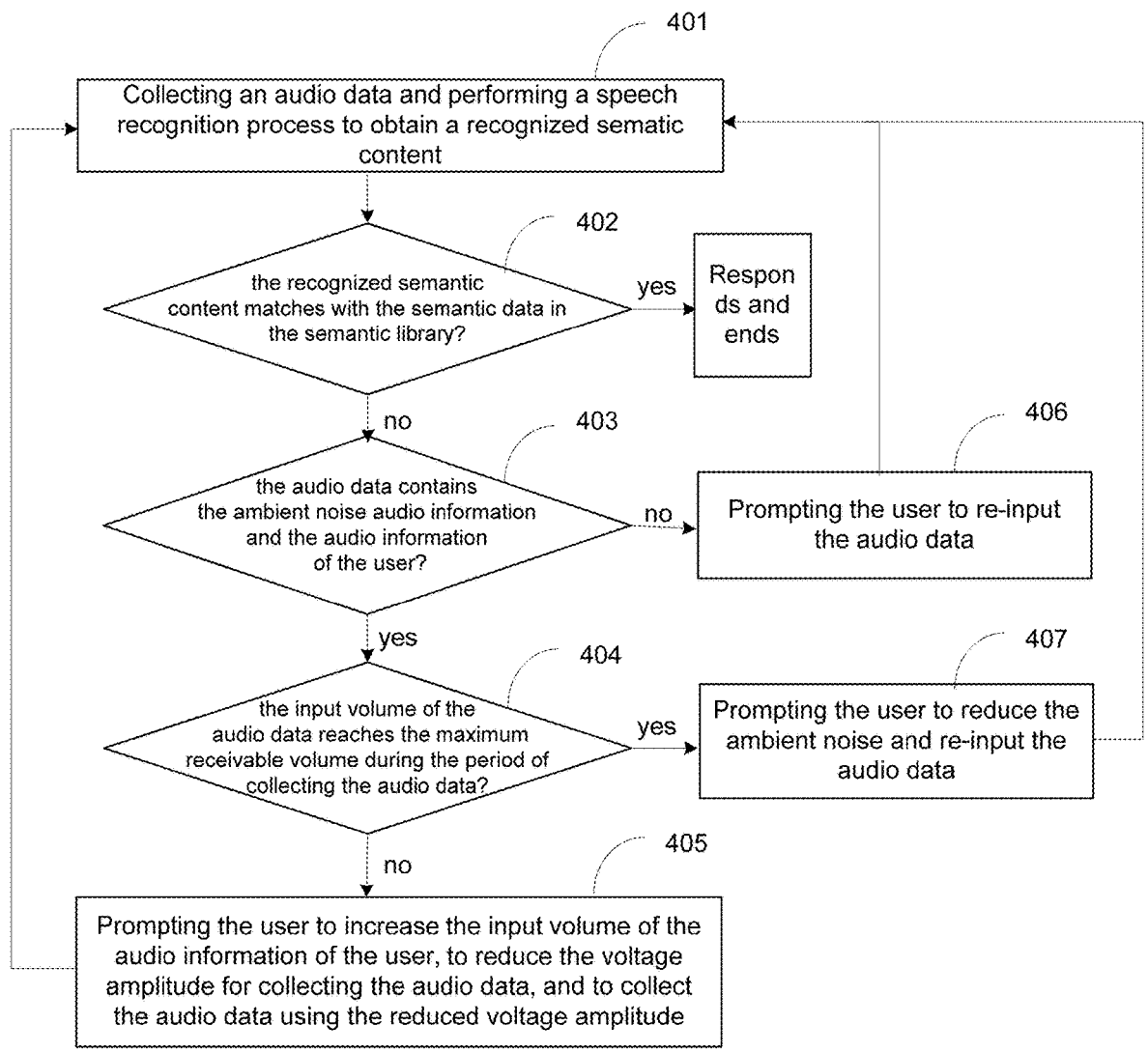
FIG. 4 shows an example flowchart illustrating a speech recognition method according to an embodiment of the present disclosure.

FIG. 4 shows an example flowchart illustrating a speech recognition method according to an embodiment of the present disclosure. As shown in FIG. 4, the speech recognition method 40 may comprise following steps.

In step 401, an audio data is collected and then a speech recognition process is performed to obtain a recognized sematic content.

Next, in step 402, it is determined whether the recognized semantic content matches with the semantic data in the semantic library. If the recognized semantic content matches with the semantic data in the semantic library, the semantic content will be responded and the method will end. Otherwise, step 403 is performed.

In step 403, it is determined whether the audio data contains the ambient noise audio information and the audio information of the user. If it does, the method proceeds to step 404, otherwise, to step 406.

In step 404, it is determined whether the input volume of the audio data reaches the maximum receivable volume during the period of collecting the audio data. If it does, the method proceeds to step 405, otherwise, to step 407.

In step 405, the user is prompted to increase the input volume of the audio information of the user, to reduce the voltage amplitude for collecting the audio data, and to collect the audio data using the reduced voltage amplitude. Then, the method returns to step 401.

In step 406, the user is prompted to re-input the audio data, and then the method returns to step 401.

According to the device for recognizing speeches and the method for speech recognition of the embodiments of the present disclosure, when the recognized semantic content cannot be matched with the semantic data in the semantic library, the processor determines whether the audio data contains the ambient noise audio information and the audio information of the user. In response to determining that the audio data contains the ambient noise audio information and the audio information of the user, the conditions for collecting the audio data in the next time can be determined according to the input volume of the audio data and the voltage amplitude used for collecting audio data during the period of collecting the audio information via the collecting circuit. Thus, the audio data collected in the next time will be optimized, resulting in an improved effect in speech recognition.

It will be apparent to those skilled in the art that various modifications and variations can be made in the present disclosure without departing from the spirit and scope of the disclosure. Provided these modifications and variations of the present disclosure fall within the scope of the claims of the present disclosure and their equivalents, the present disclosure also intends to include these modifications and variations.

What is claimed is:

1. A device for recognizing speeches, comprising:
   a collecting circuit, configured to collect an audio data;
   a memory, configured to store instructions and a database; and
   a processor, configured to execute instructions stored in the memory, to:
      perform speech recognition on the collected audio data to obtain a semantic content of the audio data;
      match the obtained semantic content with a semantic data stored in the database;
      compare an input power of the audio data with a preset power to determine whether the audio data contains ambient noise audio information and audio information of a user, in response to determining that the obtained semantic content does not match with the semantic data; and determine that the audio data contains the ambient noise audio information and the audio information of the user, in response to the input power of the audio data being greater than the preset power;

determine whether the input volume of the audio data reaches a maximum receivable volume during a period of collecting the audio data via the collecting circuit; and in response to determining that the input volume of the audio data does not reach the maximum receivable volume, prompt the user to increase the input volume of the audio information of the user, and control the collecting circuit to reduce the voltage amplitude used for collecting the audio data to a reduced voltage amplitude, so that a voltage amplitude of the audio information of the user is greater than a minimum voltage amplitude recognizable by the device and a voltage amplitude of an ambient noise audio information is smaller than the minimum voltage amplitude, and re-input the audio data by collecting the audio information of the user using the reduced voltage amplitude.

2. The device of claim 1, wherein the processor is further configured to:

in response to determining that the input volume of the audio data reaches a maximum receivable volume, prompt the user to reduce an ambient noise in a surrounding environment and to re-input the audio data.

3. The device of claim 1, wherein the processor is further configured to:

in response to determining that the audio data does not contain the ambient noise audio information, prompt the user to re-input the audio data.

4. A method for speech recognition, comprising:

collecting an audio data;

performing speech recognition on the collected audio data so as to obtain a semantic content of the audio data;

matching the obtained semantic content with a semantic data stored in a database;

comparing an input power of the audio data with a preset power to determine whether the audio data contains ambient noise audio information and audio information of a user, in response to determining that the obtained semantic content does not match with the semantic data; and determining that the audio data contains the ambient noise audio information and the audio information of the user, in response to the input power of the audio data being greater than the preset power and changing conditions for collecting the audio data and controlling to collect the audio data with the changed conditions;

wherein changing the conditions for collecting the audio data comprises:

determining whether the input volume of the audio data reaches a maximum receivable volume during a period of collecting the audio data; and prompting the user to increase the input volume of the audio information of the user, and controlling the collecting circuit to reduce the voltage amplitude used for collecting the audio data;

in response to determining that the input volume of the audio data does not reach the maximum receivable volume, prompting the user to increase the input volume of the audio information of the user, and controlling the collecting circuit to reduce the voltage amplitude used for collecting the audio data to a reduced voltage amplitude, so that a voltage amplitude of the audio information of the user is greater than a minimum voltage amplitude recognizable by the device and a voltage amplitude of an ambient noise audio information is smaller than the minimum voltage amplitude, and re-inputting the audio data by collecting the audio information of the user using the reduced voltage amplitude.

5. The method of claim 4, further comprising:

prompting the user to reduce an ambient noise in a surrounding environment and to re-input the audio data, in response to determining that the input volume of the audio data reaches a maximum receivable volume.

6. The method of claim 4, further comprising:

prompting the user to re-input the audio data in response to determining that the audio data does not contain the ambient noise audio information.

\* \* \* \* \*